United States Patent [19]

Short et al.

[11] Patent Number: 4,749,660
[45] Date of Patent: Jun. 7, 1988

[54] METHOD OF MAKING AN ARTICLE COMPRISING A BURIED SIO2 LAYER

[75] Inventors: Kenneth T. Short; Alice E. White, both of New Providence, N.J.

[73] Assignee: American Telephone and Telegraph Company, AT&T Bell Laboratories, Murray Hill, N.J.

[21] Appl. No.: 935,273

[22] Filed: Nov. 26, 1986

[51] Int. Cl.$^4$ .................... H01L 21/265; H01L 21/20
[52] U.S. Cl. ........................................ 437/24; 357/91; 437/21; 437/29; 437/83; 437/84
[58] Field of Search .............. 437/24, 25, 26, 29; 357/91

[56] References Cited

U.S. PATENT DOCUMENTS

| | | | |
|---|---|---|---|
| 4,385,937 | 5/1983 | Ohmura | 148/1.5 |
| 4,412,868 | 11/1983 | Brown et al. | 148/1.5 |
| 4,523,213 | 6/1985 | Konaka et al. | 357/23.7 |
| 4,588,447 | 5/1986 | Golecki | 148/1.5 |
| 4,676,841 | 6/1987 | Celler | 148/1.5 |

FOREIGN PATENT DOCUMENTS 2563377  10/1985  France ............... 148/DIG. 83

OTHER PUBLICATIONS

Tuppen et al, Thin Solid Films, 131 (1985) 233.
Holland et al, Jour. Non. Crystalline Solids, 71 (1985) 163.
Arienzo et al, IBM. TD13, 27 (1984) 2371.
Yoshii et al, Jap. Jour. Appl. Phys. 21 (1982), Suppl. 21-1, p. 175.
*Materials Research Society Symposia Proceedings*, vol. 53, "Silicon on Insulator Formed by O+ or N+ Ion Implantation" by P. L. F. Hemment, pp. 207-221 (1986).
Appl. Phys. Lett. 48(21), "SiO2 Buried Layer Formation by Subcritical Dose Oxygen Ion Implantation" by J. Stoemenos et al, pp. 1470-1472, May 26, 1986.
*Integrated Circuit Fabrication Technology*, by David J. Elliott, McGraw-Hill (1982).
Appl. Phys. Lett. 39(2), "A Novel Three-Step Process for Low-Defect-Density Silicon on Sapphire", by J. Amano et al, pp. 163-165, Jul. 15, 1981.

*Primary Examiner*—Upendra Roy
*Attorney, Agent, or Firm*—Eugen E. Pacher

[57] ABSTRACT

We have discovered that high quality subcritical SIMOX silicon-on-insulator wafers can be produced by a method that comprises a randomizing implant followed by an appropriate heat treatment. In a preferred embodiment, the inventive method comprises, in succession, a subcritical oxygen implant (nominal wafer temperature <350° C.) into a (100) Si wafer, a low temperature (500°-700° C.) anneal, a high temperature (>1200° C.) anneal, a randomizing implant ($\sim 5 \times 10^{14}$ Si/cm$^2$, nominal wafer temperature <100° C.), and a low temperature anneal (nominal wafer temperature between 500° and 700° C.). The resulting buried SiO2 layer typically is relatively thin (e.g., 60 nm), stoichiometric, continuous, and essentially free of Si inclusions, and the Si overlayer typically is of device quality and essentially free of twins, with $\chi$min$\sim$3%.

12 Claims, 3 Drawing Sheets

METHOD OF MAKING AN ARTICLE COMPRISING A BURIED SIO₂ LAYER

FIELD OF THE INVENTION

This invention pertains to methods for manufacturing semiconductor devices. In particular, it pertains to silicon-on-insulator (SOI) technology, and to SOI devices.

BACKGROUND OF THE INVENTION

SOI devices are known to potentially have advantages (e.g., reduced junction capacitance, increased radiation hardness) over conventional silicon devices. Several techniques for producing SOI heterostructures and, in particular, for producing Si/SiO₂/Si heterostructures of the type shown schematically in FIG. 1, are known. Among the known techniques for producing such a heterostructure is the oxygen implantation technique, and this application pertains to this particular technique (sometimes referred to as "Separation by implanted oxygen" [SIMOX]) for forming such a heterostructure. For a review of the SIMOX technique see, for instance, P. L. F. Hemment, *Materials Research Society Symposia*, Proceedings, Vol. 53, pp. 207–221 (1986).

As generally practiced in the art, the SIMOX technique comprises implanting a sufficiently high dose of oxygen into a silicon body (typically a Si wafer) such that a stoichiometric oxygen-rich region is formed within the body. By this we mean that the oxygen distribution within the silicon body reaches a maximum concentration of at least two oxygen atoms per silicon atom. A typical implantation dose is $2 \times 10^{18}$ oxygen atoms/cm². The (energy dependent) critical dose $\phi_c$ is the minimum dose at which, for a given implantation energy, a stoichiometric implant results. For instance, $\phi_c$ is about $1.4 \times 10^{18}$ cm$^{-2}$ at 200 keV.

Prior art stoichiometric implants result in the formation of relatively thick (typically about 0.3 μm or more) layers of SiO₂, with a relatively thin (exemplarily about 0.1 μm) silicon overlayer. For several reasons, it would be desirable to be able to use lower implant doses, and/or to produce SOI wafers having a thinner buried oxide layer. Lower doses are desirable because they generally produce less damage in the Si body, and because they make possible increased throughput. Thinner oxide layers make possible devices requiring lower back bias isolation voltage, as compared to devices using a prior art (thicker) buried oxide layer.

Attempts have been made to obtain these desired results by merely reducing the implant dosage below $\phi_c$ such that a substoichiometric implant region, i.e., an implanted region wherein the maximum concentration of oxygen is everywhere less than two oxygen atoms per silicon atom, is formed. See, for instance, J. Stoemenos et al, *Applied Physics Letters*, Vol. 48(21), pp. 1470-1472 (1986). These authors report that implantation of a (only slightly) subcritical dose ($1.3 \times 10^{18}$cm$^{-2}$, 200 keV) of oxygen results in formation of an oxygen-rich layer with dispersed Si islands therein, and that annealing of such a sample at 1150° C. for two hours results in a coarsening of the dispersed Si and formation of SiO₂ precipitates in the Si overlayer near the Si/SiO₂ interface. Such a wafer in general would not be acceptable for device maufacture. Stoemenos et al also report that annealing such a wafer at 1300° C. for 6 hours produces a Si overlayer free of SiO₂ precipitates but produces a buried SiO₂ layer that contains a significant volume of dispersed Si islands. It is known that such islands may act as overlapping floating gates if MOS devices were formed in such SOI wafers. Thus, such prior art SIMOX wafers typically are also not acceptable for device manufacture.

In general, two different situations can be identified. If the silicon substrate is at a relatively low nominal temperature (typically less than about 350° C.), during the subcritical ion implant, appropriate heat treatment can result in formation of a relatively homogeneous thin SiO₂ layer and recrystallization of the silicon overlayer. However, under these conditions the region of the overlayer that is adjacent to the Si/SiO₂ interface is generally heavily twinned, frequently making the heterostructure unsuitable for device fabrication. On the other hand, if during the subcritical implant the substrate is at a relatively high nominal temperature (i.e., typically greater than about 350° C.), subsequent heat treatment generally results in formation of a nonhomogeneous buried SiO₂ layer containing dispersed Si regions, and the silicon overlayer typically also comprises dispersed second phase (SiO₂) regions. In this instance also the method typically does not result in a heterostructure that is useful for device fabrication.

In view of the potential advantages associated with low dose implanatation and with SIMOX heterostructures which have a relatively thin buried SiO₂ layer, a substoichiometric (subcritical) implant technique that can be used to reliably produce a Si/SiO₂/Si heterostructure in which the buried SiO₂ layer is free of Si islands and in which the Si overlayer has a relatively low defect density and is of device quality would be of considerable significance. This application discloses such a technique.

SUMMARY OF THE INVENTION

We have discovered an implant method that can eliminate the above referred to shortcomings of the prior art subcritical implant method. The inventive method comprises a subcritical implant, and further comprises at least one randomizing implant and subsequent appropriate heat treatment, and can produce Si/SiO₂/Si heterostructures having a substantially homogeneous relatively thin buried SiO₂ layer and an overlayer of device-grade (typically $\chi_{min} < 5\%$) Si.

In a broad aspect, the inventive method comprises randomization, by any appropriate technique, of at least the region of the silicon overlayer that is adjacent to the buried SiO₂ layer, in a Si/SiO₂/Si heterostructure formed by any appropriate oxygen implantation technique, followed by an appropriate heat treatment. The details of the inventive method depend, inter alia, on the substrate temperature during the oxygen implant, as will be described below.

In an exemplary preferred embodiment the inventive method comprises providing a single crystal Si body having a predetermined crystal orientation and a major surface, implanting a subcritical dose of oxygen into the Si body through the major surface such that an oxygen-rich layer is formed within the Si body, with a silicon overlayer of relatively low oxygen content thereon. Furthermore, the embodiment comprises heat treating the oxygen-implanted Si body such that a substantially stoichiometric buried SiO₂ layer is formed from the oxygen-rich layer, with at least some of the material of the Si overlayer having the predetermined crystal orientation. The embodiment further comprises implanting Si ions through the major surface, the dose being effective for causing substantial randomization of at least the overlayer material near the SiO₂ layer/overlayer interface, and heat treating the implanted Si body such that device grade overlayer material, of substantially the predetermined crystal orientation, with relatively low defect density near the buried SiO₂ layer/overlayer interface, results.

DETAILED DESCRIPTION OF SOME PREFERRED EMBODIMENTS

Figure 1:
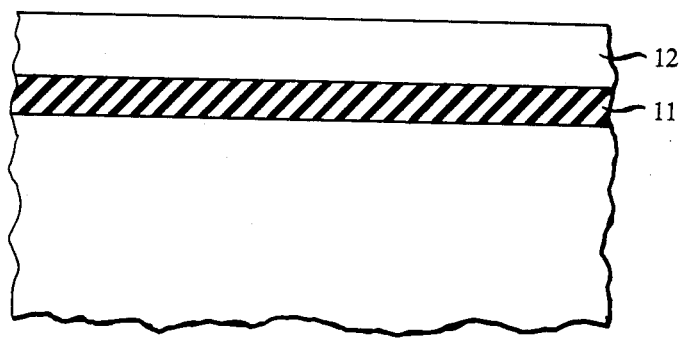
FIG. 1 schematically depicts a SOI heterostructure according to the invention.

FIG. 1 schematically depicts a SOI heterostructure 10 of the type that is of concern herein. The SiO₂ layer 11 is buried within a single crystal Si body. Desirably, Si overlayer 12 is of device quality and retains essentially the original lattice orientation of the Si body.

Figure 2:
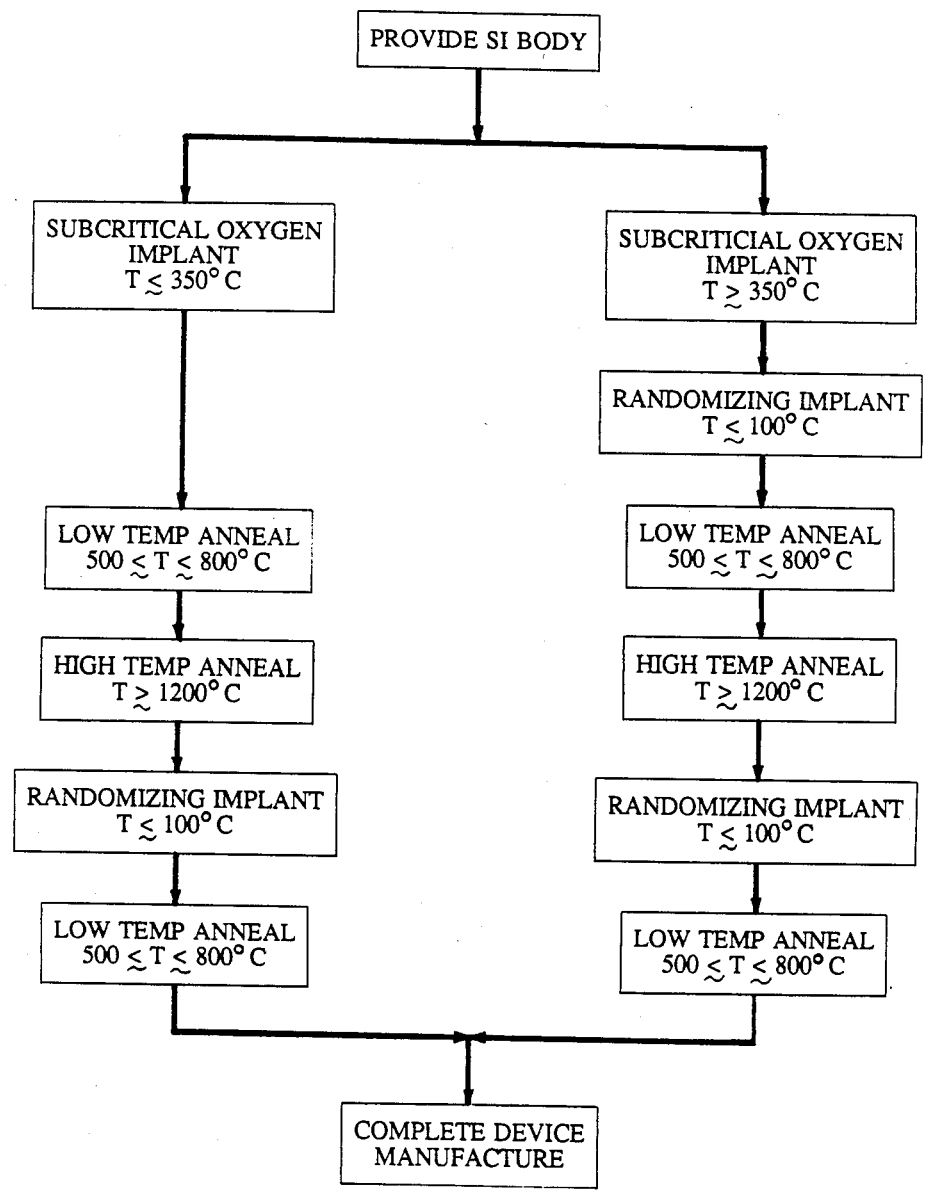
FIG. 2 is a flow chart showing schematically major process steps of two exemplary embodiments of the inventive method.

FIG. 2 is a combined flow chart for two alternative exemplary embodiments of the inventive process, in which the left and right hand branches apply for relatively low and high nominal temperature subcritical oxygen implants, respectively.

As will be appreciated by those skilled in the art, prior to the subcritical implant, the major surface of the substrate (typically a (100) surface) will be cleaned, and/or otherwise prepared. Such techniques are well known and will not be discussed herein. It is to be understood that implants are carried out in an appropriate vacuum.

Exemplarily, we have found that a subcritical implant dose advantageously is in the range from about $3 \times 10^{17}$ to about $7 \times 10^{17}$ oxygen ions/cm². However, this range is not to be considered limiting, since higher subcritical doses may be advantageously used at times, whereas even lower doses may result in useful buried SiO₂ layers.

In a currently preferred embodiment (corresponding to the left branch of FIG. 2), the nominal substrate temperature during the subcritical oxygen implant is relatively low, typically <350° C. By the "nominal" substrate temperature we mean herein the temperature at which the substrate would be, absent any beam heating effects. For instance, we typically clamp our Si wafers to a stainless steel block that is maintained at a given temperature. The temperature of the block is considered to be the nominal substrate temperature.

As shown in the left branch of FIG. 2, the (low temperature) subcritical oxygen implant is followed by an appropriate heat treatment such that substantially stoichiometric SiO₂ is formed from the oxygen-rich implant layer. Such a heat treatment advantageously comprises a low temperature anneal (exemplarily between 30 minutes and 3 hours at a temperature between 500° and 800° C., preferably not exceeding 700° C.) which typically recrystalizes amorphous Si. The heat treatment also comprises a high temperature anneal, typically at a temperature greater than 1200° C., for some appropriate extended period, exemplarily more than three hours. As will be appreciated by those skilled in the art, the annealing time typically is inversely related to the annealing temperature. A minor amount of experimentation typically will suffice to determine an appropriate time/temperature combination. Although we currently prefer two-step heat treatment as discussed above, other annealing programs (e.g., a slow ramping up of the temperature, with a high temperature soak, or a simple high temperature anneal) may also be useful.

As will be evident to those skilled in the art, the heat treatment is advantageously carried out under non-oxidizing conditions, e.g., in vacuum, or in an inert atmosphere. The prior art knowns formation of a relatively thick (e.g., 500 nm) oxide cap layer as a means for protecting the Si overlayer during the high temperature anneal. We have devised an advantageous technique for protecting the Si overlayer during a high temperature anneal. The technique, which is currently preferred by us, comprises carrying out the anneal in an atmosphere that comprises at least one inert gas as a major constituent (e.g., 99% Ar) and oxygen as a minor constituent (e.g., 1%), with the oxygen concentration being effective to result in the slow growth of a thin (e.g., 20 nm) protective SiO₂ layer during the heat treatment. The presence of this thin protective layer prevents both the pitting of the Si overlayer that frequently occurs when the annealing is carried out in nominally non-oxidizing conditions (vacuum or inert gas atmosphere), and the growth of a thick oxide layer that occurs if the annealing is carried out in more highly oxidizing conditions.

As shown in the left branch of FIG. 2, after the high temperature anneal the silicon body is subjected to a randomizing ion implant. We have found it to be advantageous to carry out the randomizing implant at a nominal substrate temperature of less than about 100° C. Typically the substrate is nominally at room temperature, and we have also achieved good results when the substrate was cooled to about liquid nitrogen temperature (77° K.). Although we believe that a relatively low substrate temperature during the randomizing implant can prevent healing of implant-produced lattice defects, it may be possible that under some conditions nominal substrate temperatures above 100° C. may also be acceptable.

Exemplarily, we have implanted silicon ions during the randomizing implant, with an exemplary dose being $3 \times 10^{14}$ Si/cm². We currently believe that particularly useful Si doses typically are in the range from $2 \times 10^{14}$ to $1 \times 10^{15}$/cm². We used implantation energies for both the subcritical oxygen implant and for the randomizing implant of 200 keV and 400 keV, respectively. However, a wide range of energies, e.g., 100 keV to about 2 MeV, is expected to be useful. Furthermore, the randomizing implant need not necessarily be a Si implant. For instance, an Ar or other noble gas implant may under some circumstances be used.

The function of the randomizing implant is, we currently believe, to amorphize at least the region of the silicon overlayer that is adjacent to the interface with the buried SiO₂ layer. However, typically the region of the bottom silicon layer that is adjacent to the interface with the buried SiO₂ layer is also amorphized. It is desirable that a portion of the top Si layer, typically the portion that is adjacent to the major surface of the silicon body, remain crystalline so as to provide a seed region for the oriented single crystal regrowth of the silicon overlayer.

In the preferred embodiment (left branch of FIG. 2) the required randomizing implant is followed by an appropriate heat treatment. Exemplarily, the treatment comprises a relatively low temperature (~600° C., >1 hr) anneal. More generally, we consider annealing tempertures in the range 500°-800° C. (preferably not exceeding 700° C.) to be useful, but under certain conditions annealing at a temperature outside of this range may also result in the regrowth of device-quality Si overlayer material. After this annealing treatment the heterostructure is stable with regard to heat treatments as ecountered in device processing.

Another, but currently less preferred, embodiment of the inventive method (right branch of FIG. 2) comprises carrying out the oxygen implant at a relatively high nominal temperature (typically at least about 350° C.), followed by a first randomizing implant of the type described above. Subsequent to completion of the first randomizing implant the implanted Si body is heat treated, substantially as discussed in the context of the currently preferred embodiment. This heat treatment advantageously is followed by an optional second randomizing implant. The conditions of the second randomizing implant typically are similar to those of the first radomizing implant. The optional second randomizing implant generally will be followed by a low temperature anneal of the type discussed in the context of the currently preferred embodiment.

After completion of the appropriate heat treatment SOI wafers according to the invention typically are ready for device fabrication by known methods. For a review of such methods see, for instance, D. H. Elliott, *Integrated Circuit Fabrication Technology*, McGraw-Hill (1982).

Figure 3:
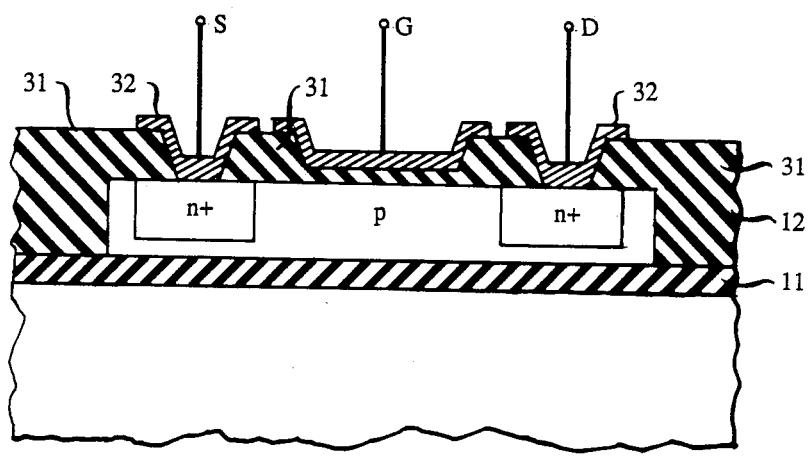
FIG. 3 schematically shows an exemplary semiconductor device formed on a SOI wafer according to the invention.

An exemplary electronic device (an enhancement-type n-channel MOS transistor) according to the invention is shown in FIG. 3, wherein layer 11 is the buried SiO$_2$ layer, and 12 refers to a portion of the Si overlayer. The portion of the overlayer is doped to be p-type, with two sub-portions being n+. Oxide regions 31 serve to isolate 12 from other devices, to define contact windows, and to provide gate insulation, all in a conventional manner. Numerals 32 refer to source, gate, and drain metal contacts.

EXAMPLE I

Figure 4:
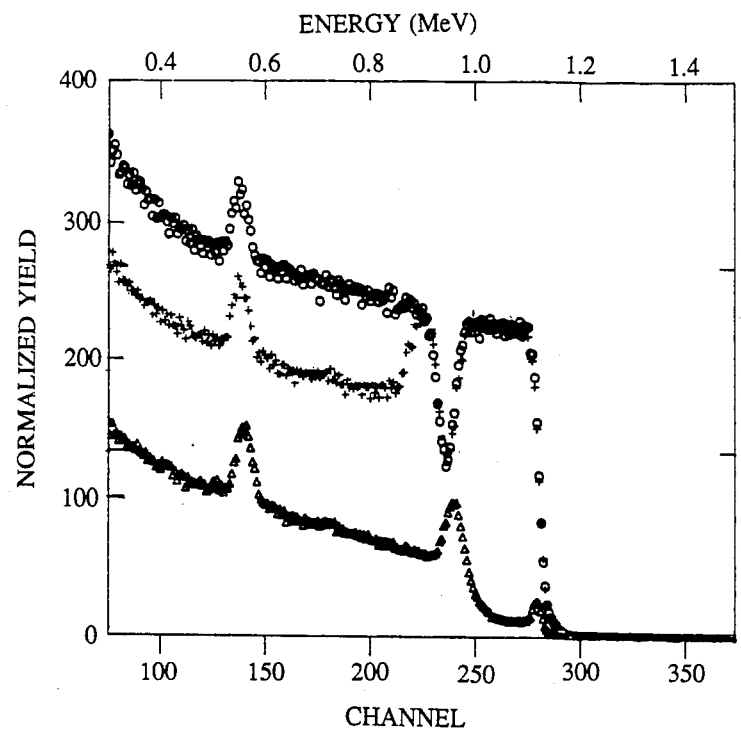
FIGS. 4 and 5 show Rutherford Backscattering Spectroscopy (RBS) spectra of an exemplary SOI heterostructure.
Figure 5:
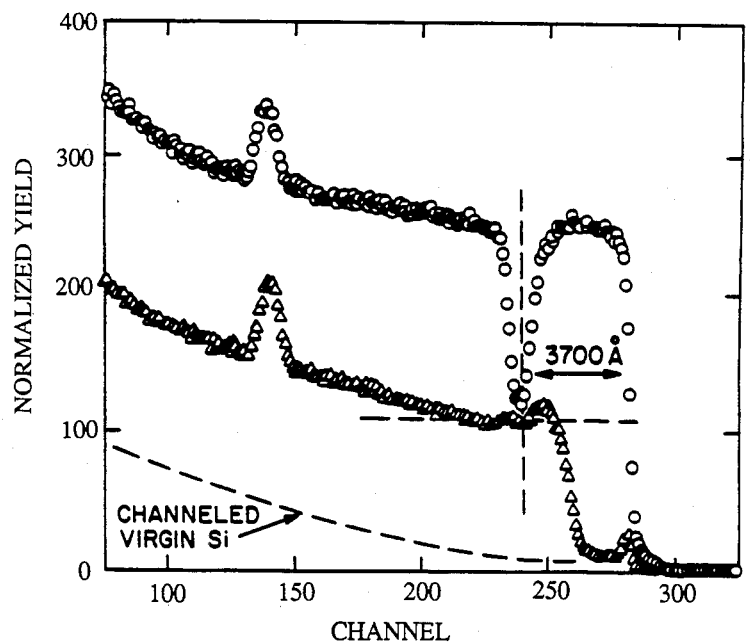

A (100) oriented single crystal Si wafer was cleaned by a conventional procedure and clamped to a stainless steel block in the target chamber of a ion implanter. With the steel block nominally at 100° C., $3 \times 10^{17}$ oxygen/cm$^2$ were implanted at 170 keV, resulting in formation of an oxygen-rich layer having an approximately Gaussian profile (depth of maximum about 370 nm, full width at half maximum about 180 nm). The wafer was transferred to a tube furnace, and maintained at 600° C. for 2 hours and at 1390° C. for 30 minutes in argon+1% oxygen. The anneal resulted in formation of an about 60 nm thick oxide layer from the oxygen-rich implant layer, with twinned Si at both interfaces. A RBS spectrum of the thus produced wafer was obtained by standard means [2 MeV He+, (100) and 5° off (100)] and is shown in FIG. 4. As is well known, such spectra, including the well known quantity $\chi_{min}$ derived from the spectra, are standard indicators of the quality of thin crystal layers. Curves 40 and 41 are the random and channeled yields, respectively, and show that the buried oxide layer is essentially stoichiometric, the nearsurface part of the Si overlayer is single crystal material, and the Si/SiO$_2$ interface regions are highly defective. Transmission electron microscopy showed the defective regions to be heavily twinned. Subsequent to RBS, the wafer was again transferred to the implanter, and $3 \times 10^{14}$ silicon/cm$^2$ (400 keV) were implanted, with the wafer nominally at liquid N$_2$ temperature. The RBS yields of the randomized wafer are shown in FIG. 5, wherein curves 50 and 51 are the random and channeled yeilds. The amorphization of the Si adjacent to the SiO$_2$ layer, with the amorphized region extending almost to the Si surface, is evident. Following RBS the wafer was annealed at 600° C. for 2 hours in vacuum. The results of subsequent RBS are also shown in FIG. 5, wherein curve 52 is the channeled yield of the wafer after the second low temperature anneal. The improvement in crystal quality, especially of the Si overlayer, is clearly evident. In particular, the SiO$_2$/Si overlayer interface was essentially free of defects, with the overlayer being of device quality, with $\chi_{min}$ of about 3%. Electron microscopy was also peformed on the wafer, and showed that the buried SiO$_2$ layer was essentially continuous, without Si islands, and with sharp boundaries, and confirmed the absence of twins in the Si overlayer.

EXAMPLE II

A second SOI wafer was prepared substantially as described in Example I, except that the nominal wafer temperature during the subcritical oxygen implant was 500° C., the oxygen implant ($4 \times 10^{17}$ oxygen/cm$^2$, 200 keV) was followed by a randomizing Si implant (nominal temperature 30° C., $1 \times 10^{15}$/cm$^2$, 460 keV), the subsequent heat treatment was followed by a second randomizing Si implant (conditions as above), and this was followed by a 600° C. anneal. The quality of the thus formed heterostructure was substantially as described in Example I.

What is claimed is:

1. Method of making an article comprising a layer of SiO$_2$ buried within a Si body, the method comprising
   (a) providing a single crystal Si body having a major surface and a crystal orientation;
   (b) implanting oxygen ions into the Si body through the major surface such that a buried oxygen-rich layer is formed in the Si body, with a Si overlayer thereon;
   (c) heat treating the oxygen-implanted Si body such that the buried SiO$_2$ layer is formed from the oxygen-rich layer;
   (d) completing making the article;
   CHARACTERIZED IN THAT
   (e) the oxygen implant is a subcritical oxygen implant; and the method further comprises
   (f) carrying out, subsequent to (b), a randomizing implant and a heat treatment such that the resulting Si overlayer is a device-grade overlayer having a relatively low defect density near the SiO$_2$/overlayer interface.

2. Method of claim 1, wherein the randomizing implant comprises implantation of Si ions, and wherein the Si body is maintained at a nominal temperature less than about 100° C. during the randomizing implant.

3. Method of claim 1, wherein the Si body is maintained at a nominal temperature less than about 350° C. during the subcritical oxygen implant, and wherein the randomizing implant is carried out subsequent to step (c), with the Si body being maintained at a nominal temperature less than about 100° C. during the randomizing implant.

4. Method of claim 1, wherein the Si body is maintained at a nominal temperature of at least about 350° C. during the substoichiometric oxygen implant, and wherein a first randomizing implant is carried out prior to step (c), with the Si body being maintained at a nominal temperature less than about 100° C. during the first randomizing implant.

5. Method of claim 1, wherein step (c) comprises contacting the Si body with an atmosphere adapted for causing the slow growth of a relatively thin $SiO_2$ layer.

6. Method of claim 2, wherein from about $2 \times 10^{14}$ to about $1 \times 10^{15}$ Si/cm$^2$ are implanted during the randomizing implant, and wherein the Si ions have an energy in the range from about 0.1 MeV to about 2 MeV.

7. Method of claim 3, wherein step (c) comprises annealing the Si body at a temperature greater than about 1200° C. and wherein the heat treatment of step (f) comprises annealing the Si body at a temperature in the range from about 500° to about 700° C. subsequent to the randomizing implant.

8. Method of claim 4, wherein step (c) comprises annealing the Si body at a temperature greater than about 1200° C.

9. Method of claim 7, wherein step (c) further comprises annealing the Si body at a temperature in the range from about 500° to 700° C.

10. Method of claim 5, wherein the atmosphére comprises inert gas as a major component and oxygen as a minor component.

11. Method of claim 8, wherein the method further comprises a second randomizing implant, carried out subsequent to step (c), the second randomizing implant being followed by an anneal of the Si body at a temperature in the range from about 500° to about 700° C.

12. Method of claim 8, wherein step (c) further comprises annealing the Si body at a temperature in the range from about 500° to about 700° C.

* * * * *